United States Patent [19]

Walworth et al.

[11] 4,117,460
[45] Sep. 26, 1978

[54] SENSING DEVICE

[75] Inventors: Kirk Sumner Walworth, Tolland; Anthony Newman Martin, Simsbury, both of Conn.

[73] Assignee: United Technologies Corporation, Hartford, Conn.

[21] Appl. No.: 737,380

[22] Filed: Nov. 1, 1976

[51] Int. Cl.² .................. G05B 11/18; G08B 5/00; G09F 9/00

[52] U.S. Cl. ........................... 340/190; 60/237; 250/227; 250/578; 318/480; 318/640; 340/380

[58] Field of Search .............. 340/190, 380; 250/227, 250/233, 552, 578; 60/237, 238, 242; 318/480, 602, 640

[56] References Cited

U.S. PATENT DOCUMENTS

| 3,354,319 | 11/1967 | Loewen et al. | 250/233 |
| 3,728,521 | 4/1973 | Borough et al. | 250/227 |
| 3,770,353 | 11/1973 | Brown et al. | 250/552 |
| 3,806,875 | 4/1974 | Georget | 340/380 |
| 3,919,561 | 11/1975 | Coberley | 250/227 |
| 3,940,608 | 2/1976 | Kissinger | 250/227 |

Primary Examiner—Donald J. Yusko
Attorney, Agent, or Firm—Robert C. Walker

[57] ABSTRACT

Apparatus for sensing and transmitting physical intelligence is disclosed. In one embodiment the intelligence is transmittable from the sensing device to a remotely positioned, intelligence processing unit. The apparatus taught has particular applicability to gas turbine engine control systems requiring the encoding and transmission of accurate physical intelligence from a hostile environment to the remotely positioned intelligence processing unit. Techniques employing time sequencing through a fiber optic circuit of the transmitted intelligence to reduce the size, weight and complexity of the apparatus are developed.

6 Claims, 4 Drawing Figures

SENSING DEVICE

BACKGROUND OF THE INVENTION

1. Field of the Invention

This invention relates to sensing devices and, more particularly, to devices employing fiber optic techniques for encoding and transmitting physical intelligence.

2. Description of the Prior Art

Modern gas turbine engines, for which the claimed apparatus was developed, have come to rely on sophisticated parameter controlling devices which are operable throughout the engine cycle to optimize engine efficiency and stability over a wide range of power levels. The most commonly varied engine parameters include fuel flow, flow path contour and pressure along the flow path. Numerous mechanical, pneumatic, electrical, hydraulic and electromechanical devices capable of varying these parameters have been developed to meet the perceived operation and environmental requirements of the engine.

The accuracy of all prior developed parameter controlling devices is, of course, limited to the accuracy of equipment within the control circuit for sensing the current position of the parameter controlling device or the temperature and pressure responses to device movement.

Engine designers and manufacturers have devoted substantial economic and valued personnel resources toward the development of improved sensing apparatus and, particularly, apparatus which can be made compatible with the hostile engine environments in which the sensing and control apparatus must operate.

SUMMARY OF THE INVENTION

A primary aim of the present invention is to provide an improved control system for a gas turbine engine. Reductions in the cost, weight and complexity of the sensing circuitry of the control system, and improvements in the accuracy of the sensing apparatus are concurrent goals. A reduction in the adverse effects of hostile, thermal and vibratory environments on the control system is sought and, in one aspect of the invention, a specific object is to reduce the sensitivity of the control system to electromagnetic interference.

In accordance with the present invention, the intelligence processing unit of the control system is positioned remotely from harsh thermal environments and is communicatively joined to a sensing unit at the device to be controlled by a multi-way fiber optic cable which is adapted to conduct a light source to the sensing unit and to return a multi-bit, encoded position signal to the intelligence processing unit.

A primary feature of the present invention is the benign location of the intelligence processing unit which is remote from the most hostile engine environments. The intelligence sensing unit in the gas turbine engine embodiment is positioned in close proximity to the controlled device. As shown, a fiber optic cable links the intelligence processing unit with the intelligence sensing unit at the engine exhaust nozzle. The fiber optic cable is adapted to conduct a light signal to the intelligence sensing unit and to return a multi-bit encoded, position signal from the sensing unit. The number of bits of intelligence comprising the encoded signal exceeds the number of optic ways joining the sensing unit to the intelligence processing unit A principal advantage of the present invention is the elimination of mechanical or electrical sensing links between the intelligence processing unit and the controlled device. A reduction in the adverse effects of electromagnetic interference on the control system is enabled by transmitting parameter intelligence through fiber optic ways in lieu of electrical cables. Improved control reliability and accuracy are made possible by positioning the intelligence processing unit at an engine location having only limited exposure to the hostile thermal influences. The apparatus comprising the present invention is readily adaptable to closed loop, control systems. Elastomeric shock mounting of the intelligence processing unit is further employable at the reduced temperature, engine location to mitigate the effects of adverse vibratory stimuli on the control system. A larger number of intelligence bits is transmittable through a limited number of optic ways.

The foregoing, and other objects, features and advantages of the present invention will become more apparent in the light of the following detailed description of the preferred embodiment thereof as shown in the accompanying drawing.

DESCRIPTION OF THE PREFERRED EMBODIMENT

Figure 1:
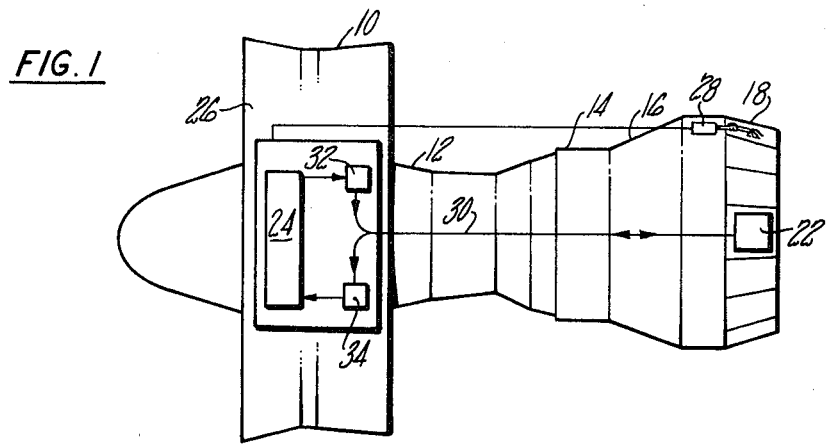
FIG. 1 is a simplified side elevation view of a gas turbine engine including exhaust nozzle control apparatus illustrated in block form.

A wide range of apparatus is capable of beneficially employing the sensing techniques of the present invention. For illustration, a gas turbine engine, exhaust nozzle embodiment is shown in FIG. 1. The engine principally comprises a fan section 10, a compression section 12, a combustion section 14, a turbine section 16 and an exhaust nozzle 18. Efficient operation of the engine requires accurate control of various parameter setting devices which are deployed about the engine. Such devices include but are not limited to variable area exhaust nozzles for controlling the engine flow path discharge aperture, actuators for setting the angle of attack of rotatable stator vanes, and flow path bleed ports for controlling the amount of air bled from the flow path of a gas turbine engine during operation.

Apparatus for controlling the aperture area of the exhaust nozzle is illustrated in simplified block form. The control apparatus includes a position encoder 22 mounted in proximity to the exhaust nozzle; an intelligence processing unit 24 mounted in an environmentally benign location such as the fan case 26; and an actuator 28 which is mechanically linked to the exhaust nozzle. The position encoder and the intelligence processing unit are communicatively joined by a fiber optic cable 30 which is adapted for the two-way transmission of light energy between the connected units. The processing unit and the actuator are joined by various electrical, mechanical or electromechanical devices, the precise nature of which is not essential to the present invention.

Figure 2:
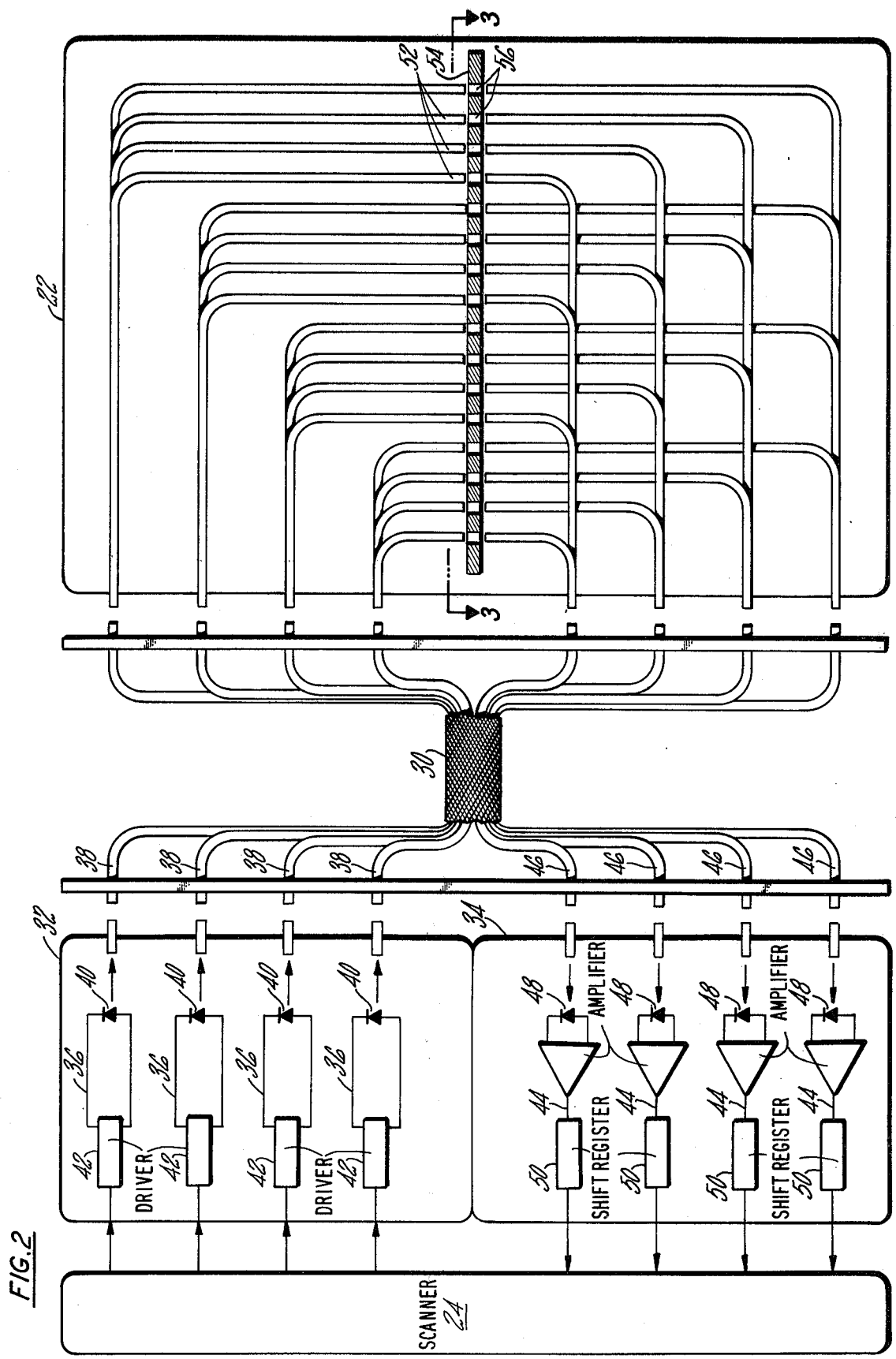
FIG. 2 is a simplified illustration of an optical, position sensing unit constructed in accordance with the present invention.

An optical transmitter 32 and an optical receiver 34 are located remotely from the position encoder. In the preferred embodiment the transmitter is mounted adjacent to or is incorporated within the intelligence processing unit 24. As is shown in FIG. 2, the transmitter 32 has a plurality of illuminating circuits 36. Each circuit is adapted for illumination of a single transmitting way 38 of the fiber optic cable 30. Four illuminating circuits 36 are shown illuminating four transmitting ways 38. Each circuit includes as principal components a light emitting diode (LED) 40 and a LED driver 42.

The receiver 34 has a plurality of light registering circuits 44. Each circuit is adapted to receive and record light entering the receiver through a single receiving way 46 of the fiber optic cable 30. Four (4) registering circuits 44 are shown. Each circuit includes as principal components, a photosensitive diode 48 and a multi-bit shift register 50.

Figure 3:
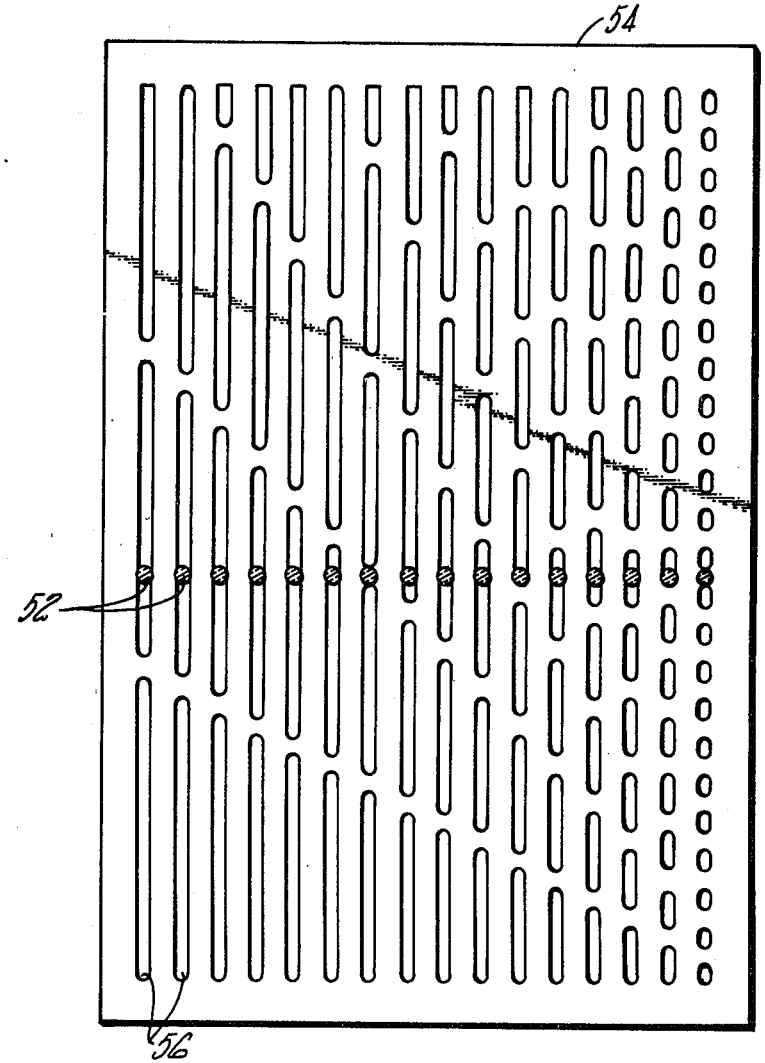
FIG. 3 is a directional view taken along the line 3—3 of FIG. 2 showing the apertures in the optical mask.

The position encoder 22 has a plurality of channels 52 formed therein through which light energy is transmittable. The optimum number of channels is equal to the product of the number of transmitting ways 38 and the number of receiving ways 46. In the FIG. 3 embodiment four transmitting ways and four receiving ways yield an optimum sixteen channels. Light energy from each single transmitting way is directed by conduit means to a plurality of channels, four as illustrated. An optical mask 54 having sixteen rows of apertures 56 is geometrically disposed within the position encoder. Each row of apertures is aligned with a single channel 52. The apertures are predisposed in an oriented pattern so as to encode a light signal representative of the position of the optical mask relative to the channels as the illuminating circuits are sequenced. The relationship between the optical mask and the channels is shown in FIGS. 2 and 3. In one embodiment the mask is movable and the channels remain stationary. In an alternate embodiment the channels are movable and the optical mask remains stationary.

During operation of the described apparatus each LED driver 42, in response to a sequenced signal, causes the associated LED 40 to emit light energy into one of the transmitting ways 38. In the present case employing four illuminating circuits, four sequenced transmissions occur. The light energy emanating from each transmitting way illuminates four channels within the position encoder 22. Each of the four illuminated channels is aligned with a corresponding receiving way 46. An "on" or "off" signal is received at each way 46 depending upon the position of the optical mask 54. For each one of the sequenced emissions, then, four optical bits of position intelligence are encoded and sent to the optical receiver 32. In the present system having four sequenced emissions, sixteen bits of intelligence are generated. Other optimized systems, for example, have three sequenced emissions producing nine bits of intelligence and five sequenced emissions producing twenty-five bits of intelligence. The greater the number of intelligence bits, the greater the position accuracy possible becomes.

The sixteen bits of generated intelligence are optically collated into four receiving ways 46. The position signal transmittable through each way, therefore, comprises four sequenced bits of intelligence, one bit from each of the four sequenced emissions of the optical transmitter.

At the receiver 32 the presence of light energy in each bit indicates an "on" signal which is registered by the photosensitive diode 48. The absence of light indicates an "off" signal. The "on/off" signal from each way is recorded by the corresponding shift register 50. Each shift register stores four bits of position intelligence, one bit for each of the sequenced transmissions. The sixteen bits of actual position intelligence thusly accumulated are subsequently transmitted to the intelligence processing unit 24. The digital "on/off" pattern produced by the encoder is highly compatible with the intelligence processing units of modern control systems, including those employing electronic or optical circuitry. The conversion of analog parameter intelligence, as sensed by the prior used systems, is not required.

The intelligence processing unit 24 relates the device position signal to the optimum position at the engine operating condition desired and causes the actuator 28 to reposition the controlled device by conventional means until the actual position and the desired position are in substantial conformance.

The control system described may be operated in closed loop fashion thereby permitting definitive control of the engine parameters even under transient operating conditions. The use of a closed-loop control will be recognized by those skilled in the art to offer substantial advantages. As a new device setting is selected by the operator, the engine continues to respond to the actual device setting as sensed by the position encoder. The integration of actual position intelligence from all controlled devices at the intelligence processing unit enables smooth operating transitions.

The number of intelligence bits transmittable through the fiber optic cable 30 exceeds the number of individual ways 38 and 46. Time sequencing of the intelligence bits enables a substantial reduction in physical hardware over that which would otherwise be required to transmit a position signal of corresponding accuracy. For example, as will be recognized by those skilled in the art, the number of ways formerly required to obtain a sixteen bit optical signal was seventeen. In the present configuration, with apparatus adapted for time sequencing, the number of required ways is eight. The reduced complexity of providing connectors for eight way cables is evident.

As is viewable in FIG. 1, the intelligence processing unit is mounted on the fan case remotely from the combustion and turbine sections of the engine. The unit may alternatively be mounted at the compression section 12. A relatively cool engine location is selected to avoid adverse thermal influence on the unit. A cool location is especially desirable where electronic components are utilized in the intelligence processing unit.

The relatively cool location additionally is compatible with elastomeric shock mounting systems for the intelligence processing unit. Shock mounting decreases the sensitivity of the unit to vibratory stimuli which may adversely effect the accuracy of the unit.

The use of the optical position sensing circuit is especially critical to the control system. The system can be no more accurate than the position signal received at the intelligence processing unit. Interference with the transmitted position signal, such as that experienced by electric cable systems responding to electromagnetic interferences, is avoided.

Figure 4:
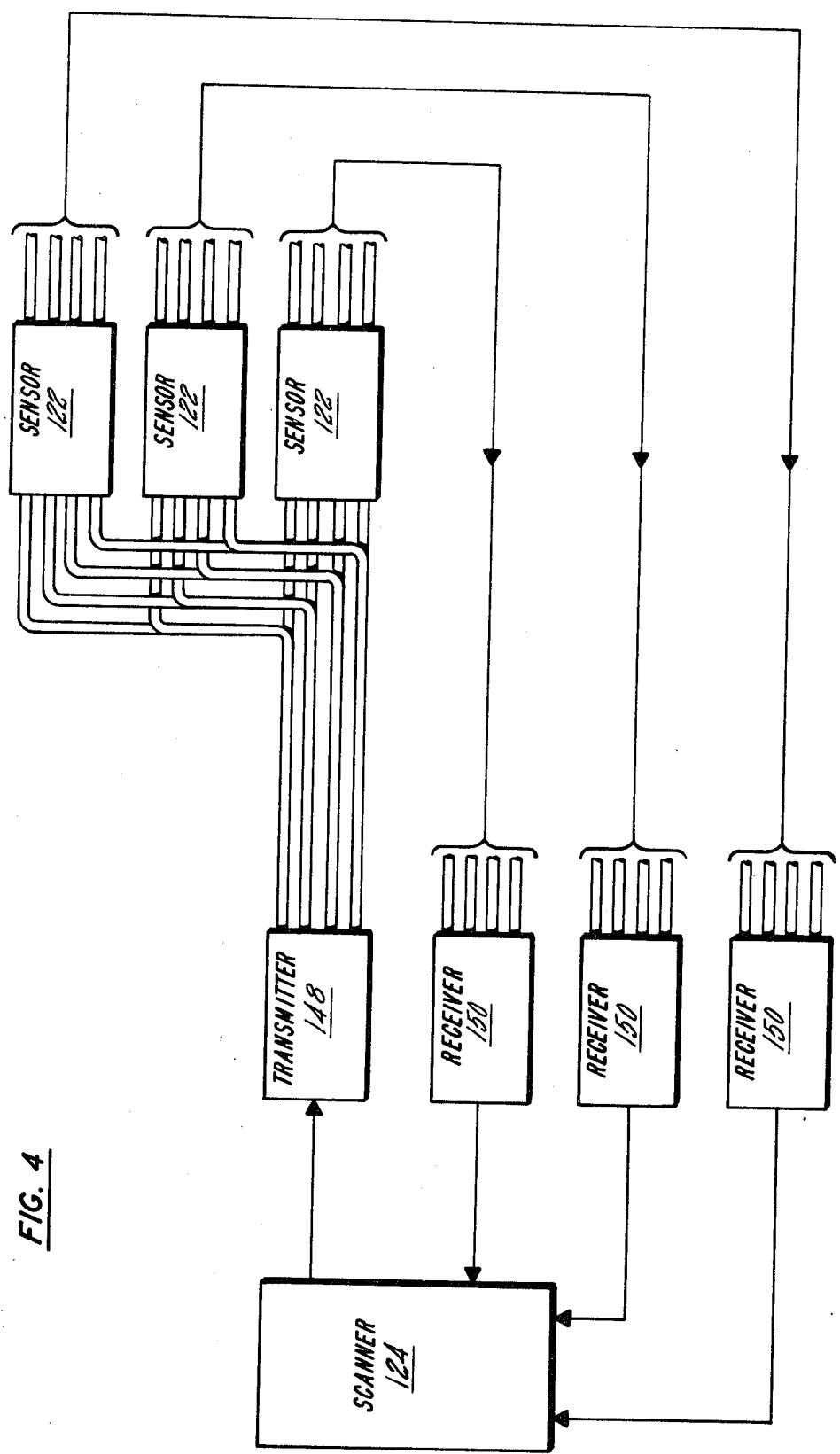
FIG. 4 is a diagrammatic representation of optical, sensing circuitry serving a plurality of controlled devices.

Those skilled in the art will further recognize that the concepts taught and claimed herein are adaptable for use with intelligence processing units capable of integrating position intelligence from a plurality of sources. Illustrated in FIG. 4 is such a processing unit 124 and the attendant transmitting 148 and receiving 150 units. A single transmitting unit 148 is capable of servicing a plurality of the sensing units 122 when optically aligned as illustrated.

In the exhaust nozzle embodiment the mask 54 or the position encoder 22 is mechanically linked to the exhaust nozzle 18. Physical movement of the exhaust nozzle is, therefore, registered as relative movement between the channels of the encoder and the apertures of the mask. In embodiments measuring pressure or temperature the optical mask is linked to a pressure or temperature transducer which produces similar relative movement.

Although the invention has been shown and described with respect to preferred embodiments thereof, it should be understood by those skilled in the art that various changes and omissions in the form and detail thereof may be made therein without departing from the spirit and the scope of the invention.

Having thus described typical embodiments of our invention, that which we claim as new and desire to secure by Letters Patent of the United States is:

1. A position sensing device comprising:
   an optical transmitter having a plurality of illuminating circuits and
   means for sequencing the emission of light energy from each of said circuits;
   an optical receiver having a plurality of registering circuits wherein each registering circuit is adapted to receive a position signal formed of the sequenced emissions of each transmitting circuit;
   for forming said position signal a position encoder having
      a plurality of channels contained therein and including
      an optical mask having a plurality of aperture rows disposed in calculated array across said channels so as to be capable of encoding, from the sequenced emissions of the transmitter, a position signal comprising multiple bits of intelligence which represent the position of the optical mask relative to the channels;
   means for collating the multiple bits of intelligence into one or more position signals for transmission to said receiver; and
   optically transmissive means communicatively joining the transmitter to the position encoder and position encoder to the receiver.

2. A position sensing device comprising:
   an optical transmitter having a plurality of illuminating circuits, each of which principally comprises
      a light emitting diode and
      a light emitting diode driver, and
      means for sequencing the emission of light energy from each of said circuits;
   an optical receiver having a plurality of registering circuits, each of which principally comprises
      a photosensitive diode and
      a shift register,
   wherein said registering circuit is adapted to receive a position signal formed of the sequenced emissions of each transmitting circuit;
   for forming said position signal, a position encoder having
      a plurality of channels contained therein and including
      an optical mask having a plurality of aperture rows disposed in calculated array across said channels so as to be capable of encoding, from the sequenced emissions of the transmitter, a position signal comprising multiple bits of intelligence which represent the position of the optical mask relative to the channels;
   means for collating the multiple bits of intelligence into one or more position signals for transmission to said receiver; and
   a filter cable, which is adapted for the transmission of light energy therethrough, having
      a plurality of transmitting ways optically joining each illuminating circuit the transmitter to the position encoder and
      a plurality of receiving ways optically joining the channels of the position encoder to the registering circuits of the receiver.

3. The invention according to claim 2 wherein said optical transmitter has four illuminating circuits.

4. The invention according to claim 3 wherein said optical receiver has four registering circuits.

5. The invention according to claim 4 wherein said position encoder has sixteen channels and said optical mask has sixteen rows of apertures.

6. The invention according to claim 5 wherein said fiber cable has four transmitting ways and four receiving ways.

* * * * *

UNITED STATES PATENT AND TRADEMARK OFFICE
CERTIFICATE OF CORRECTION

PATENT NO. : 4,117,460

DATED : September 26, 1978

INVENTOR(S) : KIRK SUMNER WALWORTH ET AL

It is certified that error appears in the above-identified patent and that said Letters Patent are hereby corrected as shown below:

Claim 2, column 6, line 32: "filter" should read -- fiber --.

Signed and Sealed this

Eighth Day of May 1979

[SEAL]

Attest:

RUTH C. MASON
Attesting Officer

DONALD W. BANNER
Commissioner of Patents and Trademarks